US011076220B2

(12) United States Patent
Adams

(10) Patent No.: US 11,076,220 B2
(45) Date of Patent: Jul. 27, 2021

(54) LOUDSPEAKER SYSTEM

(75) Inventor: Michael Charles Adams, Vista, CA (US)

(73) Assignee: VUE AUDIOTECHNIK LLC, Escondido, CA (US)

(*) Notice: Subject to any disclaimer, the term of this patent is extended or adjusted under 35 U.S.C. 154(b) by 297 days.

(21) Appl. No.: 13/494,928

(22) Filed: Jun. 12, 2012

(65) Prior Publication Data

US 2013/0322656 A1 Dec. 5, 2013

Related U.S. Application Data

(60) Provisional application No. 61/653,856, filed on May 31, 2012.

(51) Int. Cl.

*H03F 99/00* (2009.01)
*H04R 1/26* (2006.01)
*H04R 1/20* (2006.01)
*H04R 1/28* (2006.01)
*H04R 3/12* (2006.01)

(52) U.S. Cl.

CPC ............. *H04R 1/26* (2013.01); *H04R 1/2819* (2013.01); *H04R 1/2842* (2013.01); *H04R 3/12* (2013.01); *H04R 2201/028* (2013.01)

(58) Field of Classification Search

CPC ...... H04R 1/2807; H04R 1/2842; H04R 1/00; H04R 1/227; H04R 1/2823; H04R 1/26; H04R 1/2819; H04R 3/12; H04R 2201/028

USPC ......... 381/120, 351, 345, 304, 335, 89, 337, 381/349, 161

See application file for complete search history.

(56) References Cited

U.S. PATENT DOCUMENTS 2,688,373 A 9/1954 Olson
3,688,864 A * 9/1972 Guss ........................ H04R 1/26 381/89
4,450,929 A 5/1984 Marrs
4,769,848 A 9/1988 Eberbach
4,783,820 A * 11/1988 Lyngdorf .............. H04R 1/227 181/145
5,092,424 A 3/1992 Schreiber
5,321,756 A 6/1994 Patterson, Jr.
5,657,392 A * 8/1997 Bouchard ................ H04R 1/02 181/145

(Continued)

FOREIGN PATENT DOCUMENTS

WO WO 01/35696 A2 5/2001

OTHER PUBLICATIONS (https://web.archive.org/web/20040612090908/https://en.wikipedia.org/wiki/Subwoofer) (Year: 2004).*

*Primary Examiner* — Ammar T Hamid

(74) *Attorney, Agent, or Firm* — Haynes and Boone, LLP

(57) ABSTRACT

Provided are loudspeaker systems. Embodiments include a first speaker to provide a direct radiating output from the front of the loudspeaker system and a second speaker to drive a ported side chamber of the loudspeaker system, wherein the first and second speakers share a ported common chamber, and wherein at least one port of the ported common chamber exits the front of the loudspeaker system. In one embodiment, the common chamber includes at least one port that is substantially aligned with the front of the loudspeaker system. In another embodiment, each speaker is coupled to a separate amplifier and signal processing unit.

20 Claims, 13 Drawing Sheets

(56) References Cited

U.S. PATENT DOCUMENTS

| | | | | |
|---|---|---|---|---|
| 5,870,484 | A * | 2/1999 | Greenberger | H04S 3/002 381/300 |
| 5,970,153 | A | 10/1999 | Petroff | |
| 6,031,921 | A | 2/2000 | Mizoguchi | |
| 6,504,938 | B1 * | 1/2003 | Anderson | H04R 1/2849 181/145 |
| 7,136,498 | B1 | 11/2006 | Schott | |
| 7,983,436 | B2 * | 7/2011 | Nichols | H04R 1/2873 381/335 |
| 2007/0201711 | A1 * | 8/2007 | Meyer | H04R 1/403 381/182 |
| 2008/0137894 | A1 * | 6/2008 | Christner | H04R 1/323 381/349 |
| 2009/0190784 | A1 * | 7/2009 | Ong | H04R 1/2819 381/351 |
| 2012/0106750 | A1 | 5/2012 | Thormundsson | |

* cited by examiner

*-Prior Art-*

*-Prior Art-*

LOUDSPEAKER SYSTEM

This application claims the benefit of U.S. Provisional Application No. 61/653,856, titled LOUDSPEAKER SYSTEM and filed on May 31, 2012, which is hereby incorporated by reference in its entirety herein.

FIELD

The present disclosure relates generally to loudspeaker systems and enclosures, and more particularly to ported loudspeaker systems and enclosures.

BACKGROUND

A ported loudspeaker uses the sound from the rear side of a speaker diaphragm to increase the efficiency of the loudspeaker at low frequencies as compared to a typical sealed or closed box loudspeaker or a closed box mounting. FIG. 7 depicts a conventional ported loudspeaker 700 having a driver (e.g., also referred to as a speaker or electroacoustic transducer), which provides direct radiating output from the front of the loudspeaker, and a port providing additional output indirectly from the rear of the driver. The port can enhance the reproduction of low frequencies generated by the loudspeaker. As shown in FIG. 7, the port generally consists of one or more tubes mounted in the front of the enclosure. Depending on the exact relationship between driver characteristics, the enclosure volume, and the port cross-sectional area and length, the low frequency limit and/or efficiency of the loudspeaker can be substantially improved over the performance of a similarly sized sealed enclosure loudspeaker. However, especially when the loudspeaker is designed to operate over a relatively large range of frequencies, the increase in efficiency can lead to transducer excursion and damage to the driver when producing large sound pressure level (SPL) output.

FIG. 8 depicts a typical bandpass loudspeaker 800. Bandpass loudspeakers can be designed to finely tune the trade-off between bandwidth and efficiency. In a conventional fourth-order bandpass loudspeaker, the driver is mounted inside a dual-chambered box, with one chamber sealed, and the other chamber ported. In the conventional arrangement, sound waves emerge from the ported side of the bandpass loudspeaker only. The sound that comes out of the port can have a narrow frequency range or passband that is characterized by a substantially symmetrical second-order high-pass and second-order low pass frequency response.

Similar conventional bandpass loudspeaker designs have been in use for close to 80 years. For example, Andre d' Alton filed a patent directed to bandpass loudspeakers in 1934 (U.S. Pat. No. 1,969,704), and Henry Lange filed a similarly directed patent in 1952. Laurie Fincham's AES Convention paper entitled "A Bandpass Loudspeaker Enclosure" (AES Preprint #1512) renewed interest in 1979. In 1982, two French designers, Augris and Santens published a hand calculator design system for sealed rear chamber bandpass speakers in the French publication L' Audiophile. Bose was awarded a patent on vented front and rear bandpass enclosures in 1985 (U.S. Pat. No. 4,549,631), which later became the Acoustimass™ three piece speaker system. Earl Geddes presented an AES Paper in 1986 (preprint #2383) titled "Bandpass loudspeaker Enclosure," which was revised and republished in JAES in May 1989. Jean Margerand published a method similar to Augris' and Santens' methodology in Speaker Builder 6/88.

Many speaker manufacturers design loudspeakers to maximize SPL output. However, sound definition can be sacrificed (e.g., distortion increased, or passband narrowed) when SPL is maximized for a particular loudspeaker. Thus, there exists a desire for a loudspeaker system with improved output and sound definition which overcomes one or more drawbacks of conventional loudspeakers.

SUMMARY OF THE EMBODIMENTS

Loudspeaker systems are disclosed and claimed herein. In one embodiment, a loudspeaker system includes a first speaker to provide a direct radiating output from the front of the loudspeaker system and a second speaker to drive a ported side chamber of the loudspeaker system, wherein the first and second speakers share a ported common chamber, and wherein at least one port of the ported common chamber exits the front of the loudspeaker system.

In another embodiment, a loudspeaker system includes an enclosure having a ported common chamber and a ported side chamber, a first speaker providing a direct radiating output, and a second speaker driving the ported side chamber of the enclosure, wherein the first and second speakers share the ported common chamber of the enclosure, and wherein at least one port of the ported common chamber exits the front of the loudspeaker system.

Other aspects, objects, desirable features, and advantages of the embodiments disclosed herein will be apparent to one skilled in the relevant art in view of the following detailed description of the embodiments.

BRIEF DESCRIPTION OF THE DRAWINGS

The features, objects, and advantages of the present disclosure will become more apparent from the detailed description set forth below when taken in conjunction with the drawings in which like reference characters identify correspondingly throughout and wherein.

DETAILED DESCRIPTION OF EXEMPLARY EMBODIMENTS

Overview and Terminology

Figure 1A:
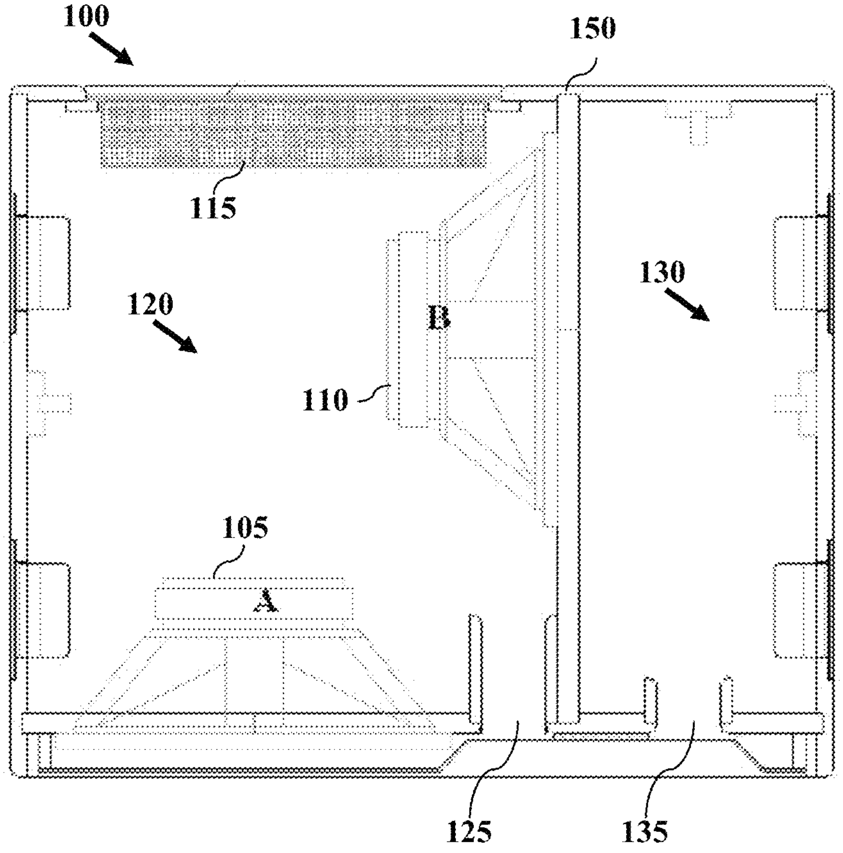
FIG. 1A depicts a simplified diagram of a loudspeaker system according to one or more embodiments.

Loudspeaker systems are described herein. One aspect of the disclosure relates to providing a loudspeaker system configuration. According to one embodiment, a loudspeaker system is provided to reduce distortion while optimizing the amplitude and phase responses of a relatively compact low frequency loudspeaker system. The loudspeaker system may be a hybrid loudspeaker system combining attributes of direct radiating and bandpass loudspeaker configurations. In certain embodiments, the hybrid loudspeaker system may include two substantially identical low frequency speakers that are coupled to and share a ported common chamber. One of the speakers may be arranged to provide direct radiating output from the front of the loudspeaker system, while the other speaker may be arranged to drive a ported side chamber. In one embodiment, a port of the ported common chamber may exit the front of the loudspeaker system and be located between the speaker providing direct radiating output and the ported side chamber. The ported side chamber may be constructed to have substantially fourth-order response characteristics, for example. In some embodiments, the combined or hybrid loudspeaker system may provide an output passband with substantially sixth-order high-pass response characteristics and substantially first-order low-pass response characteristics. A high order high-pass response characteristic can effectively reduce unwanted very low frequency (VLF) noise (e.g., "rumble"), while a low order low-pass response characteristic may be advantageous for crossing-over to the next higher frequency band (e.g., such as a higher frequency band reproduced by a separate loudspeaker).

Higher order response characteristics better define the frequency band, which can help attenuate out of band signals or noise which can cause a loudspeaker system to sound "muddy" or not well defined, particularly with respect to lower frequencies. Higher order response characteristics also help to better define the associated edge frequency of the overall selected frequency passband making for a noticeably more articulate low frequency output. For example, if the slope is only 12 dB per octave (e.g., typically a second-order response characteristic) and the edge frequency is 60 hz, then at one octave below that edge frequency, or 30 hz in this case, the signal is 12 dB down from the normalized output. If the slope were to be 24 dB per octave (e.g., typically a fourth-order response characteristic), then the output at 30 Hz would then be 24 dB down from the normalized output. Thus, the steeper slope will attenuate those signals below the designed edge frequency at a faster rate, thereby making the designed cut off frequency, or roll off point, better defined acoustically. This can result in a cleaner, clearer output, with less interference from unwanted signals below the design cut off frequency. This can also be helped with the use of an electronic filter to further acoustic improvements, as described more fully below.

According to another embodiment, a loudspeaker system may include a pair of speakers, wherein each speaker is coupled to its own amplifier and signal processing circuitry. In one embodiment, the separate amplifier and signal processing circuitry enables, at least in part, the summed acoustic output of the loudspeaker system to be substantially uniform in both magnitude and phase with very low distortion and high output capability.

In this case, "uniform" may mean that the magnitude and phase of the speakers are relatively free from anomalies caused by interaction between the separate acoustical sources (e.g., the speakers), or that the magnitude and phase vary slowly about a centerline characteristic of the system. The outputs can sum substantially free from destructive interference, which would otherwise cause a reduction in acoustical output and a nonlinear response characteristic for the loudspeaker system. Due the nature of the direct radiating speaker, its upper response as related to overall bandwidth is only limited by practicality (e.g., cost and/or availability) and the physical parameters of the chosen speaker. Embodiments according to the present design allow a loudspeaker system manufacturer to select an upper cut off frequency to suit a desired loudspeaker system performance.

Figure 9:
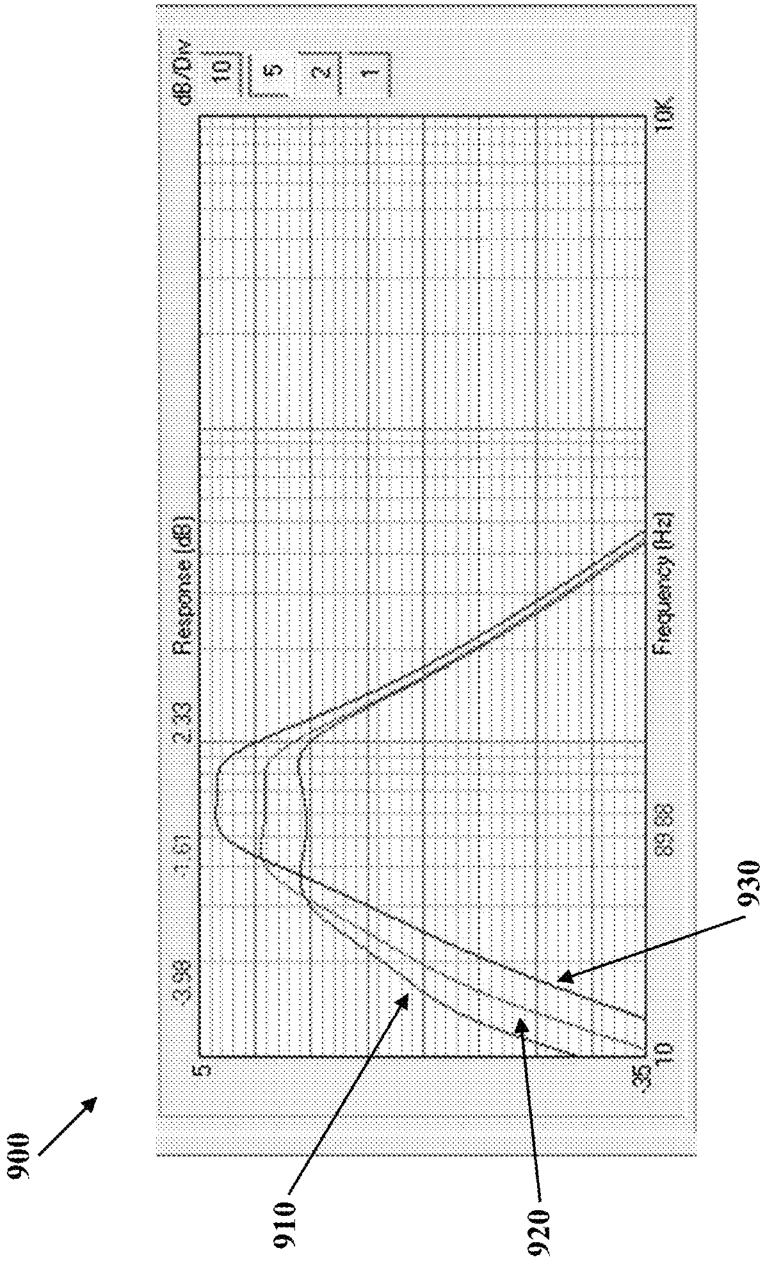
FIG. 9 illustrates the output of a typical bandpass loudspeaker.

For example, as illustrated by graph 900 in FIG. 9, the output of a conventional bandpass loudspeaker has two distinct cut off edge frequencies. These upper and lower roll off points may be a function of chamber size and port tunings, and three different chamber sizes/port tunings are represented by traces 910, 920, and 930. The conventional design can be manipulated for high output at the sacrifice of a narrow overall passband with substantial loss at the low frequency end (e.g., as shown by trace 930) or, at the other extreme, for a very wide passband with excellent low frequency response at the expense of overall output (e.g., as shown by trace 910). Furthermore, as can be seen from FIG. 9, the maximum response of the three designs is also limited by the nature of the bandpass loudspeaker topology.

Figure 10:
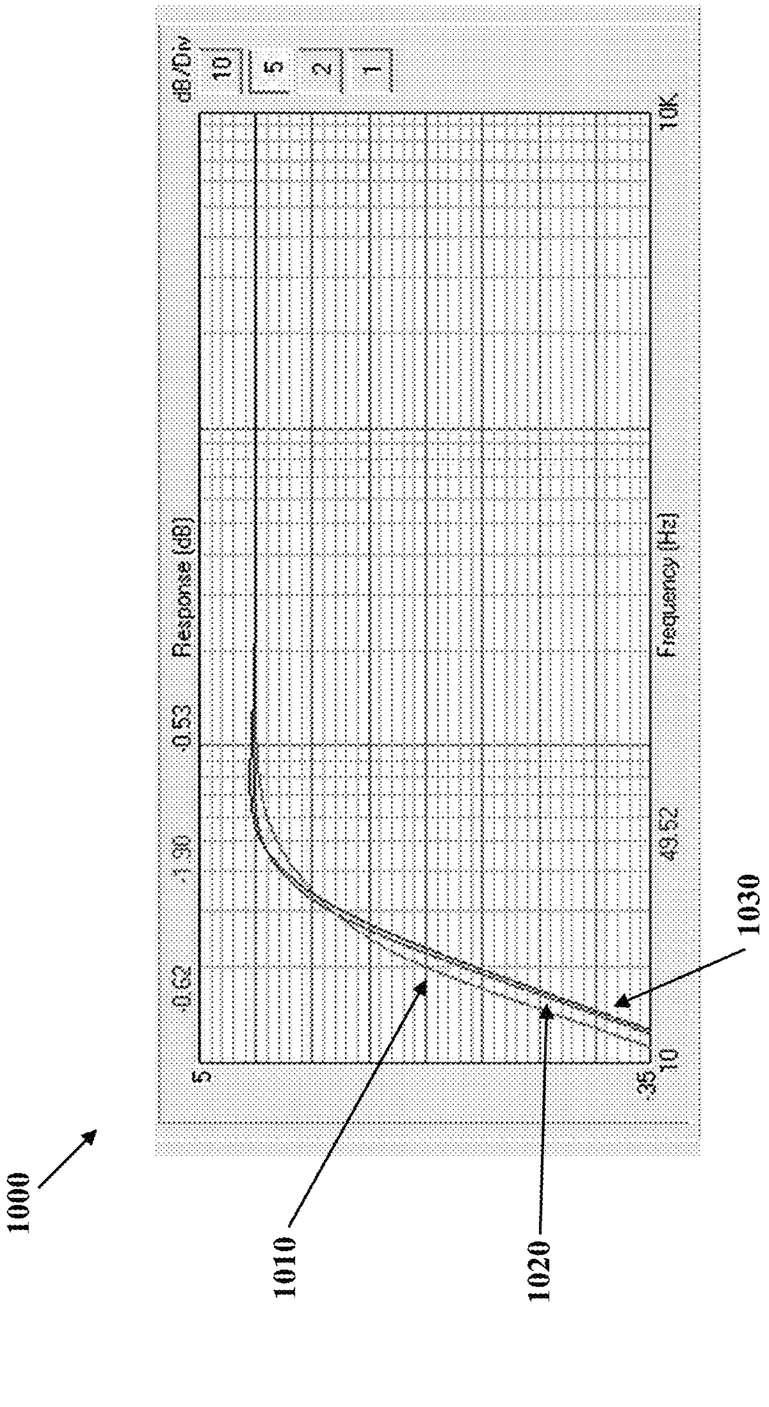
FIG. 10 illustrates the output of a typical ported loudspeaker.

By contrast, only the lower cut off point of the output of a conventional direct radiating design, as illustrated by graph 1000 in FIG. 10, is controlled by the chamber size/port tuning. Graph 1000 includes traces 1010, 1020, and 1030 illustrating examples of different tunings and how they affect the low frequency response. As can be seen from traces 1010, 1020, and 1030, the upper frequency response of the conventional direct radiating design is not affected by the chamber/port design, which allows a designer to select an upper frequency cut off point through the use of crossover filters.

Figure 11:
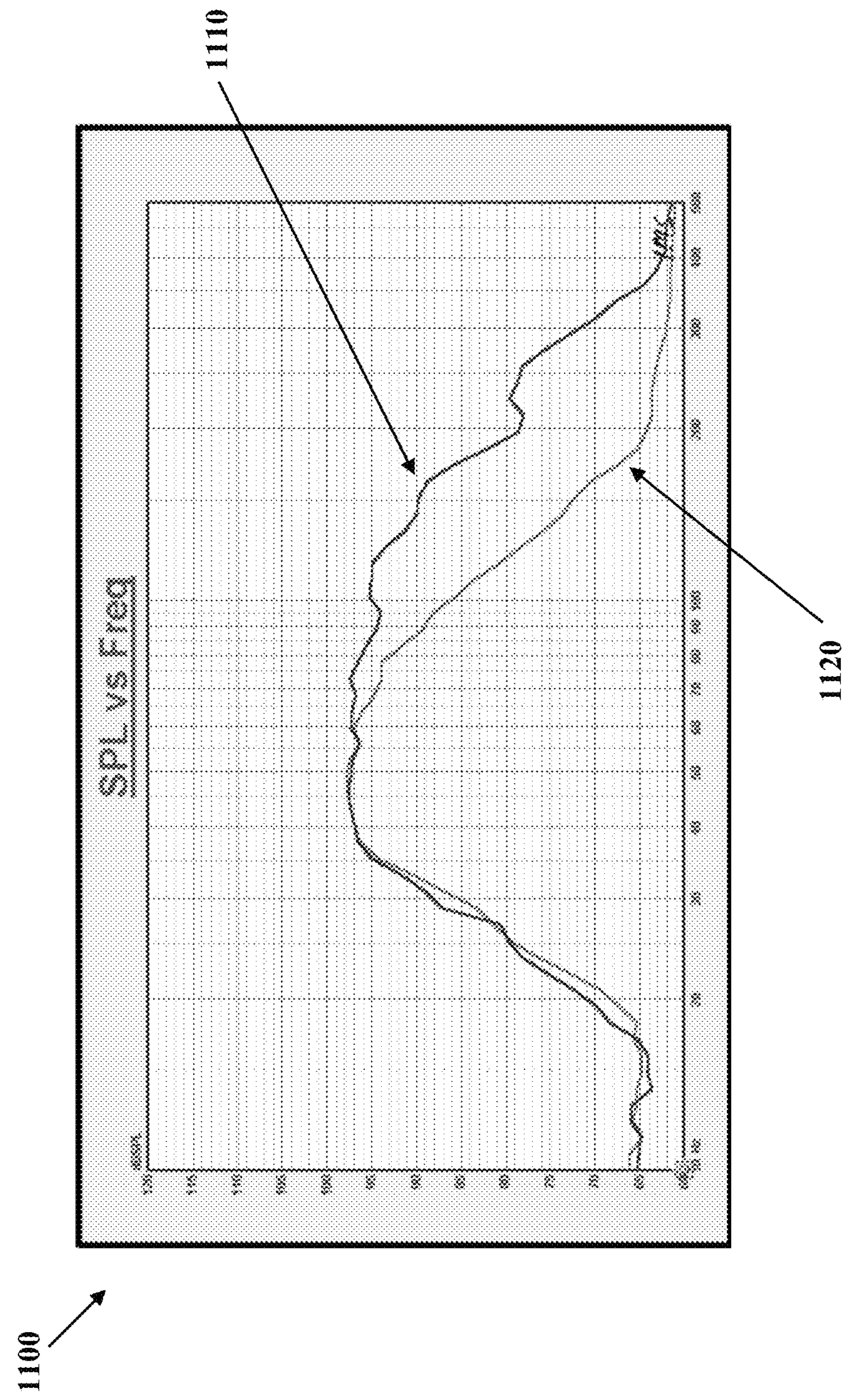
FIG. 11 illustrates the output of a loudspeaker system according to one or more embodiments.

According to the embodiments of a hybrid loudspeaker system described herein, the response characteristics of the bandpass design are combined and balanced with the direct radiating design to expand the selection of an upper frequency cut off point. For example, FIG. 11 includes graph 1100 illustrating one example of an actual measured response of a hybrid loudspeaker system using two different upper crossover frequencies, represented by traces 1110 and 1120. Trace 1110 represents the output of a hybrid loudspeaker system with a crossover point set at 150 Hz, and trace 1120 represents the output of a hybrid loudspeaker system with a crossover point set at 80 Hz. Thus, unlike a conventional bandpass design, embodiments of the present system include an upper cut off frequency that is selectable and is not fixed by chamber characteristics/port tunings.

Figure 12:
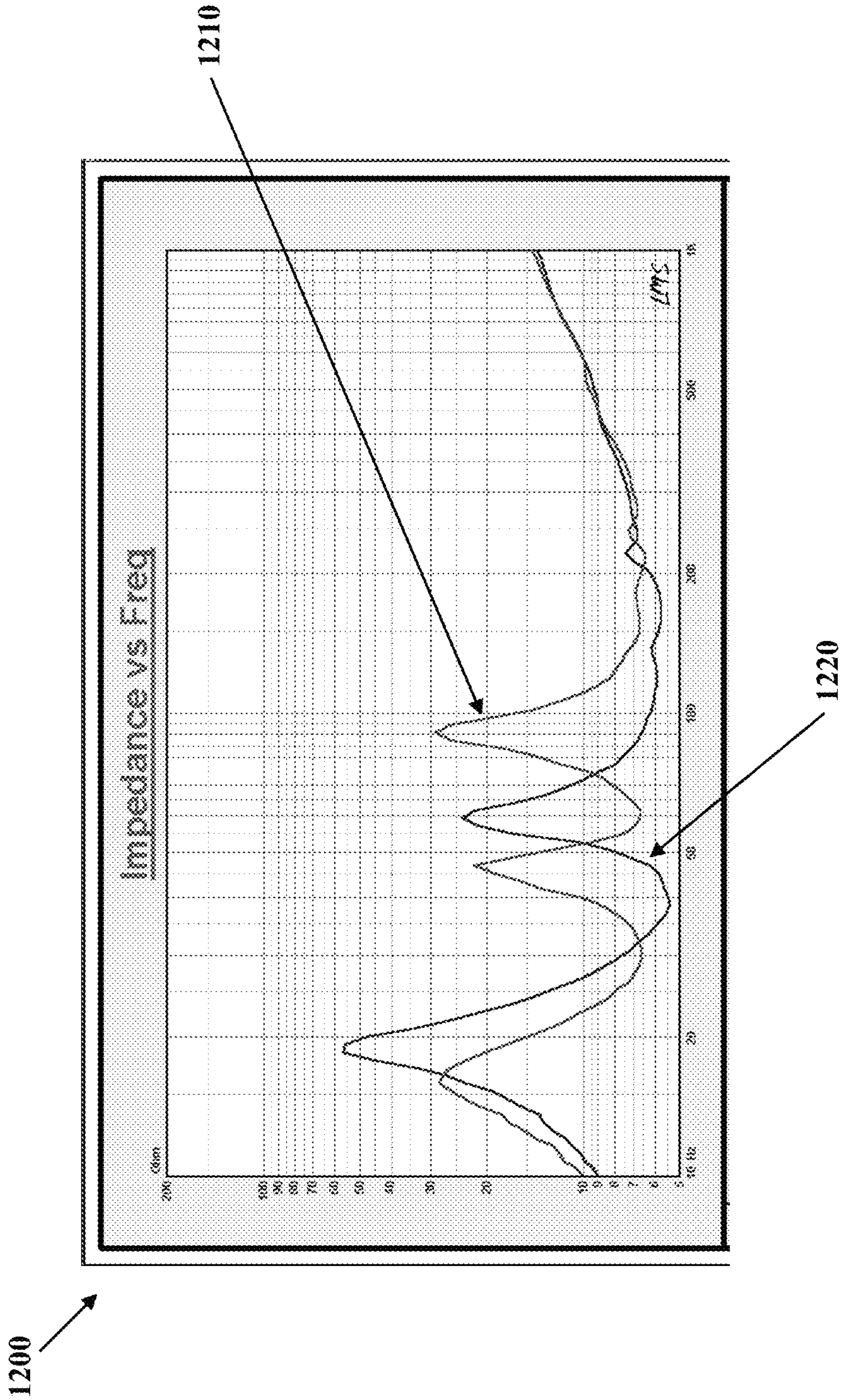
FIG. 12 illustrates the impedance a loudspeaker system according to one or more embodiments.

FIG. 12 emphasizes the uniqueness of the present embodiments. FIG. 12 illustrates an impedance graph 1200 of two speakers in a hybrid loudspeaker system according to the present embodiments, where both speakers are under power with signal processing applied to align the system. Trace 1220 illustrates how the direct radiating speaker may exhibit a single bass reflex-like impedance curve while trace 1210 illustrates how the interior speaker may, at the same time, exhibit a conventional bandpass loudspeaker impedance curve with two distinct tunings. The distinctness of the curves is an advantageous and unexpected result given that the two speakers share a common chamber.

Another aspect of the disclosure is to provide an enclosure for a hybrid loudspeaker system that combines attributes of direct radiating and bandpass loudspeaker configurations. In one embodiment, the enclosure may include a ported common chamber coupled to two speakers and a ported side chamber driven by one of the two speakers. The port tunings of the ported chambers may combine to minimize transducer excursion of the speakers within an operating passband of the hybrid loudspeaker system, thereby minimizing risk of physical damage while maximizing output.

As used herein, the terms "a" or "an" shall mean one or more than one. The term "plurality" shall mean two or more than two. The term "another" is defined as a second or more. The terms "including" and/or "having" are open ended (e.g., comprising). The term "or" as used herein is to be interpreted as inclusive or meaning any one or any combination. Therefore, "A, B or C"" means any of the following: A; B; C; A and B; A and C; B and C; A, B and C". An exception to this definition will occur only when a combination of elements, functions, steps or acts are in some way inherently mutually exclusive.

Reference throughout this document to "one embodiment," "certain embodiments," "an embodiment," or similar term means that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics may be combined in any suitable manner in one or more embodiments without limitation.

Exemplary Embodiments

FIG. 1A depicts a simplified diagram of a loudspeaker system according to one or more embodiments. Loudspeaker system 100 includes first and second speakers, depicted as speakers 105 and 110, and circuit elements 115 all coupled to enclosure 150. According to one embodiment, speaker 105 and speaker 110 may be coupled to and share ported common chamber 120. According to another embodiment, speaker 110 may drive ported side chamber 130, which may be an additional chamber of enclosure 150. As shown in FIG. 1A, loudspeaker system 100 may include port 125 for ported common chamber 120 and port 135 for ported side chamber 130. In one embodiment, port 125 may exit the front of the loudspeaker system, for example, and may be located between speaker 105 and ported side chamber 130. In another embodiment, port 135 may also exit the front of the loudspeaker system, for example, and may be located near the center of the front face of ported side chamber 130. According to some embodiments, ported common chamber 120 and ported side chamber 130 may be provided as vented chambers.

Although ported common chamber 120 is shown including only port 125, in other embodiments, ported common chamber 120 may include a plurality of ports of one or more sizes and shapes that may or may not be similar to the size and shape of port 125. In some embodiments, ported side chamber 130 may also include a plurality of ports of one or more sizes and shapes that may or may not be similar to the size and shape of port 135. In one embodiment, at least one port of ported common chamber 120 and/or ported side chamber 130 may be substantially aligned with the front of loudspeaker system 100, as shown with ports 125 and 135, for example. In a similar embodiment, at least one port of ported common chamber 120 and/or ported side chamber 130 may be substantially aligned with each other, as shown with ports 125 and 135, for example. The lengths of ports 125 and 135, as well as any other ports of the ported chambers of loudspeaker system 100, may be individually varied according to particular desired port tunings, operating passbands, or other acoustical or mechanical characteristics of ported common chamber 120, ported side chamber 130, and loudspeaker system 100. For example, a first large port having a specified cross-sectional area and length may be replaced with two or more smaller ports with cross-sectional areas adding up to the cross-sectional area of the first large port and with lengths the same as the first large port without changing the port tuning of the chamber/loudspeaker system.

In another embodiment, loudspeaker system 100 may include circuit elements 115 to provide system optimized power amplification and signal processing individualized for each speaker or, alternatively, configured to drive all speakers coupled serially or in parallel. Circuit elements 115 may additionally provide a balance of output levels and definition by limiting output to particular preferred operating frequencies or passband, such as frequencies between 35 and 80 Hz.

Another advantage may be provided by speaker 105 providing direct radiating output of sound from the front of loudspeaker system 100, while speaker 110 drives ported side chamber 130, which may have fourth-order response characteristics. In some embodiments, at least one of the speaker configuration, port arrangement and number, and circuitry provided by loudspeaker system 100 enables the summed acoustic output of speakers 105 and 110 and ports 125 and 135 to be exceptionally flat and/or uniform in both magnitude and phase while keeping the overall distortion significantly lower than that produced by similarly sized conventional loudspeakers operating at the same acoustic output levels and over the same frequency ranges. Furthermore, number, size, shape, and length of the ports of the ported chambers, as well as the size and shape of the ported chambers themselves, collectively referred to as port tunings of the ported chambers, may be adjusted to interact and combine to minimize transducer excursion of speakers 105 and 110 within an operating passband of loudspeaker system 100. Excessive transducer excursion can produce intense undesirable distortion as well as cause physical damage to a speaker. Using port tunings to minimize transducer excursion allows embodiments to safely maximize output levels over a relatively broad passband.

As shown in FIG. 1A, speaker 105 may be arranged to provide a direct radiating output from the front of loudspeaker system 100, while speaker 110 may be arranged in a bandpass loudspeaker configuration. For example, the front of speaker 105 may provide the direct radiating output, and the front of speaker 110 may drive ported side chamber 130. In some embodiments, speakers 105 and 110 may be low frequency speakers and/or be substantially identical to each other. For example, speakers 105 and 110 may be "woofers" and be constructed to operate most efficiently at frequencies below 500 Hz, such as frequencies between 35 and 80 Hz. According to one embodiment, speakers 105 and 110 may be 18 inch woofers with relatively large voice coils (e.g., 100 mm/4 inch) for increased efficiency and power handling. In other embodiments, speakers 105 and 110 may be sized differently from each other, for example, but still be capable of acoustical alignment and/or synchronization by adjusting chamber sizes, port tunings, and amplifier and signal processing characteristics.

In one embodiment, each of speakers 105 and 110 may be coupled to/driven by a separate amplifier and/or a signal processing unit. A signal processing unit may include digital and/or analog signal processing circuitry. According to a separate embodiment, speakers 105 and 110 may be coupled to/driven by a single amplifier and/or signal processing unit.

In one embodiment, circuit elements 115 may include such amplifier and signal processing circuitry. In other embodiments, circuit elements 115 may include one or more signal inputs to connect external amplifiers, signal processing units, or other audio devices to one of or both speakers 105 and 110.

Figure 1B:
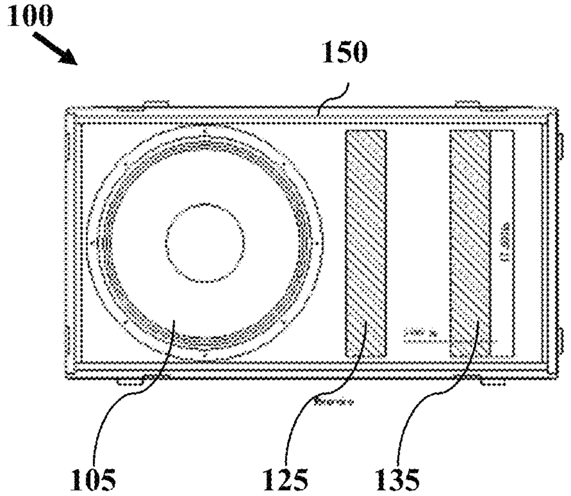
FIG. 1B depicts a graphical representation of the loudspeaker system of FIG. 1A.

FIG. 1B depicts a graphical representation of loudspeaker system 100. In FIG. 1B, speaker 105, port 125 and port 135 are shown in relation to a front face of enclosure 150/loudspeaker system 100. Although ports 125 and 135 are shown as substantially rectangular and aligned with the front face of enclosure 150, in other embodiments, one or more of ports 125 and 135 may have an oval or other shape different from a rectangular shape and may be oriented at an angle with respect to the front face of enclosure 150.

Figure 2:
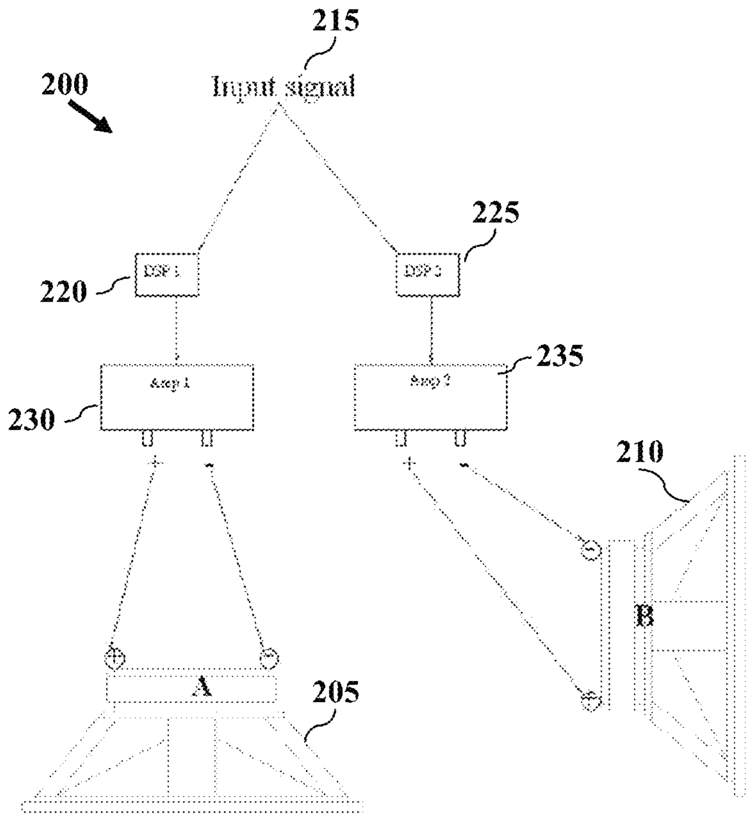
FIG. 2 depicts a simplified diagram of a loudspeaker system configuration according to one or more embodiments.

Referring now to FIG. 2, a simplified diagram is depicted of a loudspeaker system configuration according to one or more embodiments. Loudspeaker system configuration 200 includes speaker 205 and speaker 210, which can share a ported common chamber and an input 215 to receive a signal, such as a digital or analog signal from a receiver or other electronic media or audio device (not shown in FIG. 2). According to one embodiment, each speaker may be coupled to/driven by a separate amplifier circuit and signal processing circuit, as shown in FIG. 2. Loudspeaker system configuration 200 includes signal processing unit 220 and amplifier 230 for driving speaker 205 and signal processing unit 225 and amplifier 235 for driving speaker 210. Signal processing units 220 and 225 may represent analog and/or digital signal processing circuitry, for example, and may, in some embodiments, be integrated with respective amplifiers 230 and 235. Each circuit element (e.g., input 215, signal processing units 220 and 225, and amplifiers 230 and 235) may be combined, co-located, and/or integrated into a single collection of circuit elements, such as circuit elements 115 in FIG. 1A.

In one embodiment, signal processing units 220 and 225 and amplifiers 230 and 235 may employ a number of different strategies, individually or in combination, to combine the outputs of speakers 205 and 210 as well as the outputs of ports associated with the chambers housing speakers 205 and 210 (e.g., ports 125 and 135 of ported common chamber 120 and ported side chamber 130 in FIG. 1A). For example, each separate chain of driving circuitry may include circuit elements providing one or more of substantially identical high-pass and low-pass filters, program equalization appropriate to each speaker, and program delay to synchronize the acoustic outputs of each speaker. In some embodiments, the driving circuitry may be configured to synchronize the acoustic output of at least one of the speakers with the output of at least one port associated with the chambers housing the speakers.

According to another embodiment, a plurality of speakers of a loudspeaker system may be connected to a single amplifier and/or signal processing unit. In such embodiment, the reduced cost of shared driving circuitry may be offset by a 3 dB diminution of sensitivity as compared to an embodiment with separate circuitry, due, at least in part, to inaccurate alignment and/or synchronization of the speakers and the ports of the loudspeaker system.

Figure 3A:
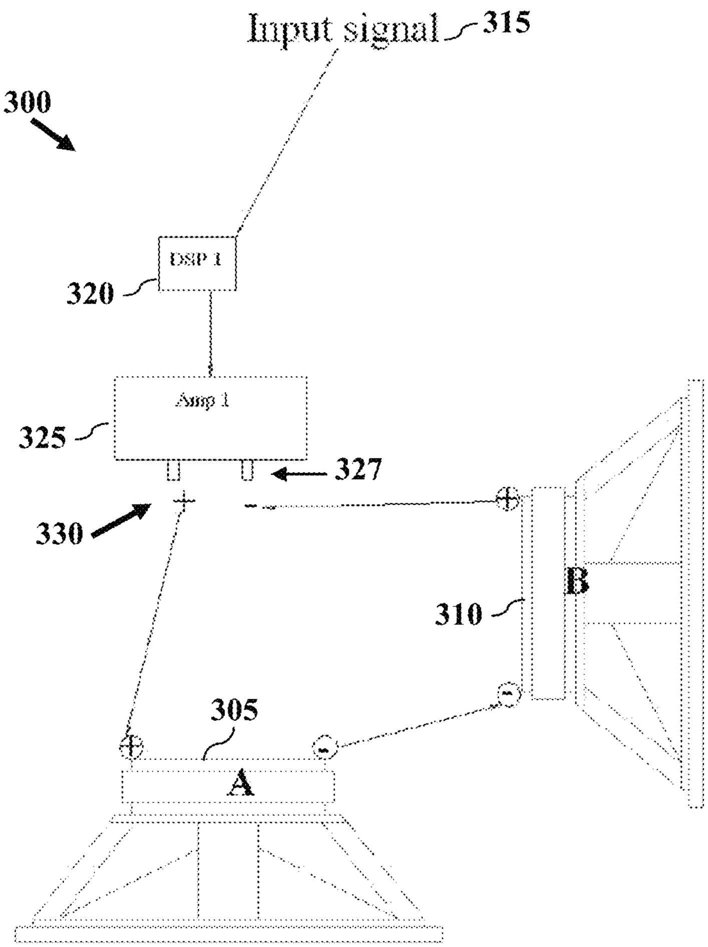
FIGS. 3A-3B depict simplified diagrams of loudspeaker system configurations according to one or more embodiments.
Figure 3B:
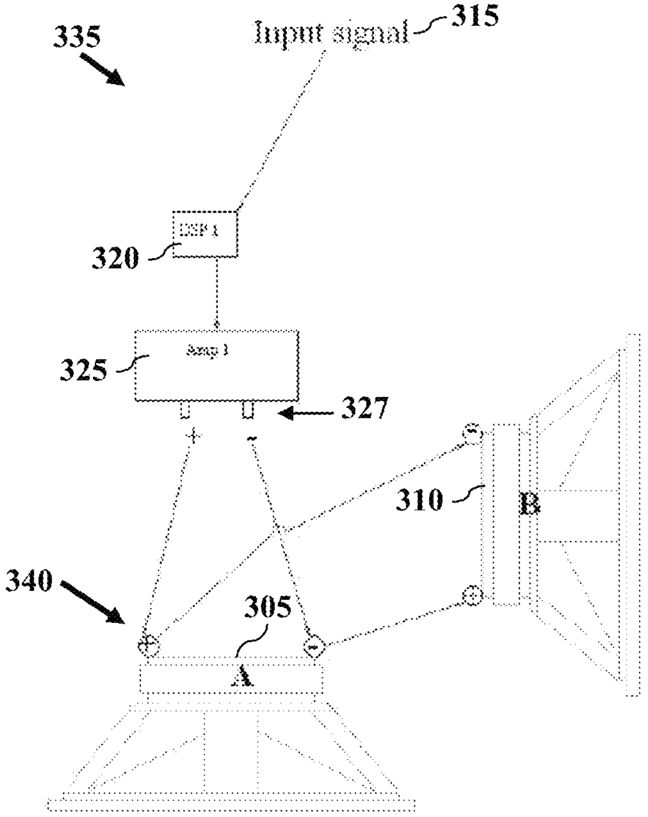

Referring now to FIGS. 3A-3B, simplified diagrams are depicted of loudspeaker system configurations according to one or more embodiments. Loudspeaker system configuration 300 includes speaker 305 and speaker 310, which can share a ported common chamber, an input 315, and driving circuitry. According to one embodiment, both speakers may be coupled to/driven by a single amplifier circuit and signal processing circuit. Loudspeaker system configuration 300 includes signal processing unit 320 and amplifier 325 coupled to/driving speakers 305 and 310. As shown in FIG. 3A, amplifier 325 and speakers 305 and 310 are coupled in a series configuration, as designated by 330, with respect to terminals 327 of amplifier 325. FIG. 3B depicts an embodiment similar to FIG. 3A utilizing a single amplifier 325 and signal processing unit 320 coupled to/driving speakers 305 and 310. However, amplifier 325 and speakers 305 and 310 in loudspeaker system configuration 335 are coupled in a parallel configuration, as designated by 340, with respect to terminals 327 of amplifier 325. In some embodiments, one of speakers 305 and 310 may be coupled to amplifier 325 with inverted polarity, regardless of whether series configuration 330 or parallel configuration 340 is used. Additionally, in either configuration 330 or 340, the connections between terminals 327 of amplifier 325 to speaker 305 may be swapped with the connections between terminals 327 of amplifier 325 to speaker 310 without also degrading the operation of loudspeaker system configuration 300 or 335.

Figure 4A:
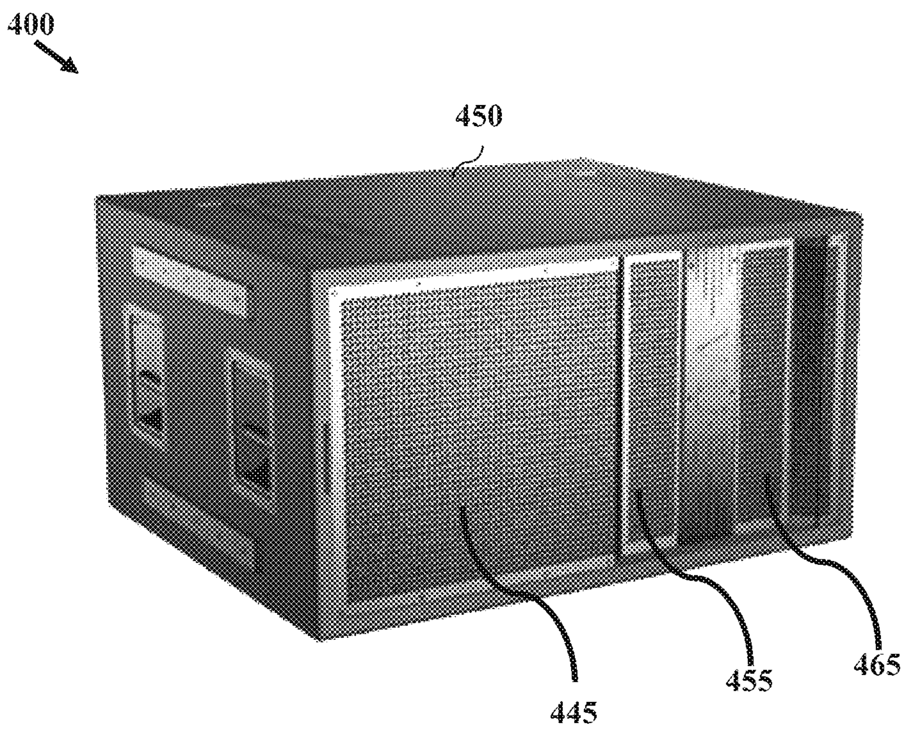
FIGS. 4A-4B depicts a graphical representation of a loudspeaker system enclosure housing a loudspeaker system according to one or more embodiments.

FIG. 4A depicts a graphical representation of an enclosure housing a loudspeaker system according to one or more embodiments described herein. Loudspeaker system 400 and enclosure 450 may include screen 445 for a direct radiating speaker, for example, and screens 455 and 465 for ports of one or more ported chambers of loudspeaker system 400 (e.g., ports 125 and 135 of ported common chamber 120 and ported side chamber 130 shown in FIG. 1). Screen 445, 455 and 465 may be cloth, plastic, or metal screens, for example, or any material that may be configured to protect the speaker or port they cover and/or to alter the individual frequency response of the speaker or port they cover. Enclosure 450 may be made from wood, plastic, metal, stone, or other workable or moldable materials, for example, and may include extensive interior bracing for reducing resonances in the output of loudspeaker system 400.

Figure 4B:
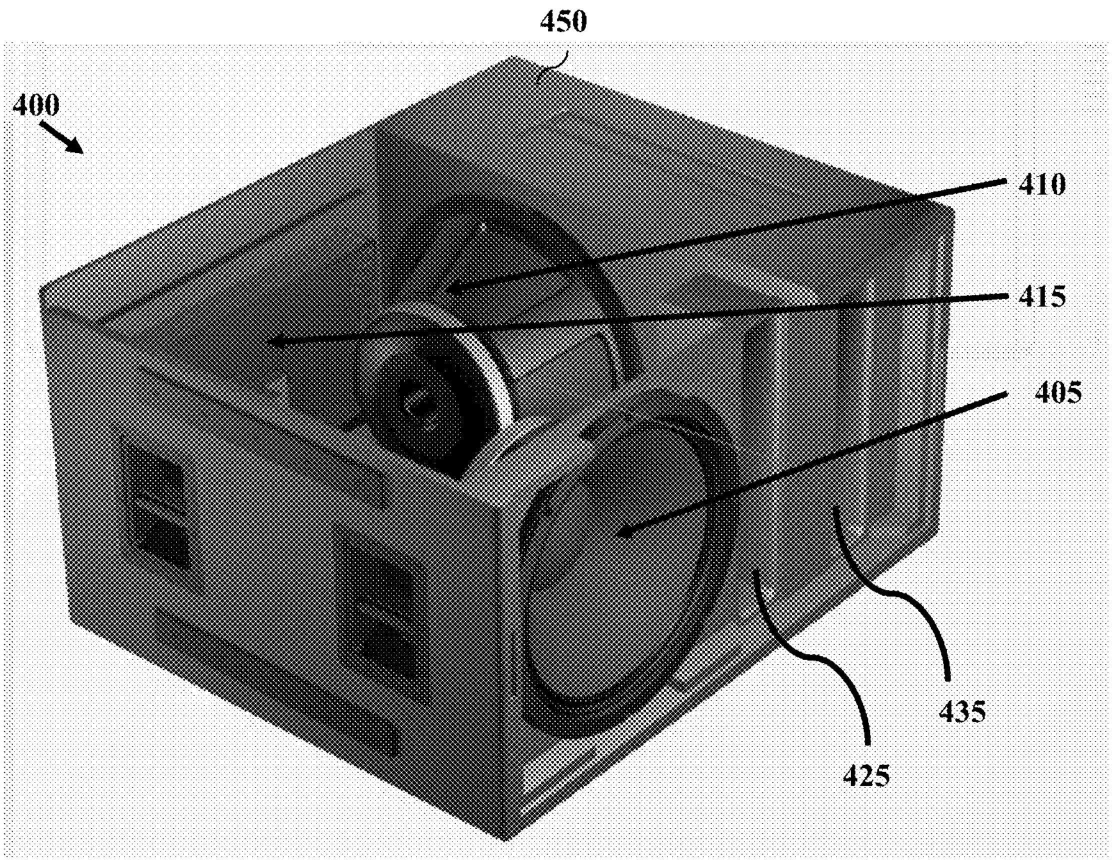

FIG. 4B depicts a graphical representation of an enclosure housing a loudspeaker system according to one or more embodiments described herein. Loudspeaker system 400 and enclosure 450 are depicted in a revealed presentation in FIG. 4B and include ports 425 and 435 for ported chambers (e.g., ported common chamber 120 and ported side chamber 130 in FIG. 1), speaker 405 configured to provide direct radiating output from the front of loudspeaker system 400, circuit elements 415, and speaker 410 configured to provide a bandpass speaker configuration. Speakers 405 and 410 are coupled to and share a ported common chamber, wherein the front of speaker 405 provides direct radiating output from the front of loudspeaker system 400, and the front of speaker 410 drives a ported side chamber of enclosure 450. Circuit elements 415 can include speaker-specific amplification and signal processing circuitry to optimize and synchronize the acoustic outputs of speakers 405 and 410 and ports 425 and 435.

Figure 5:
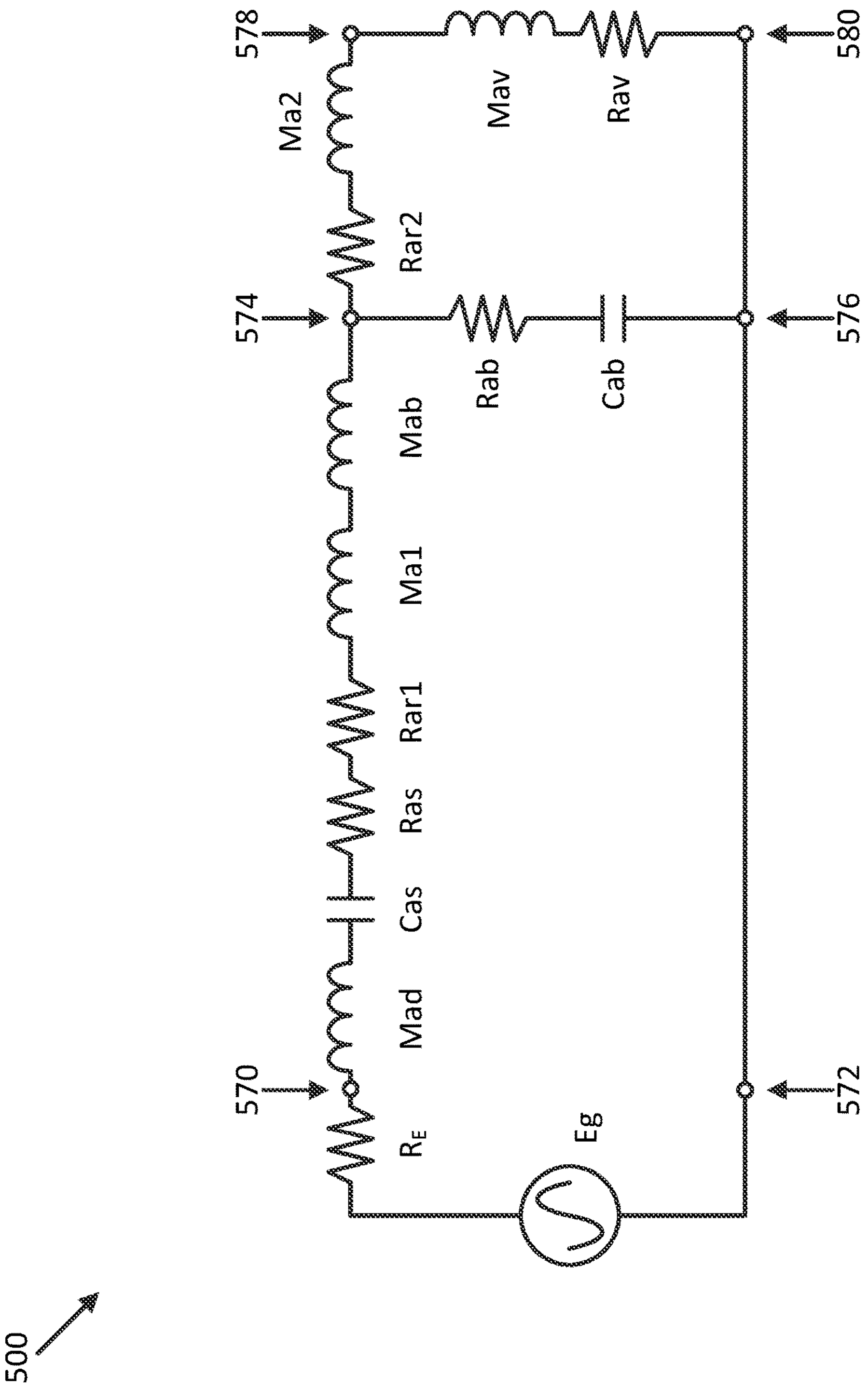
FIG. 5 depicts a representation of a loudspeaker system configuration according to one or more embodiments.
Figure 6:
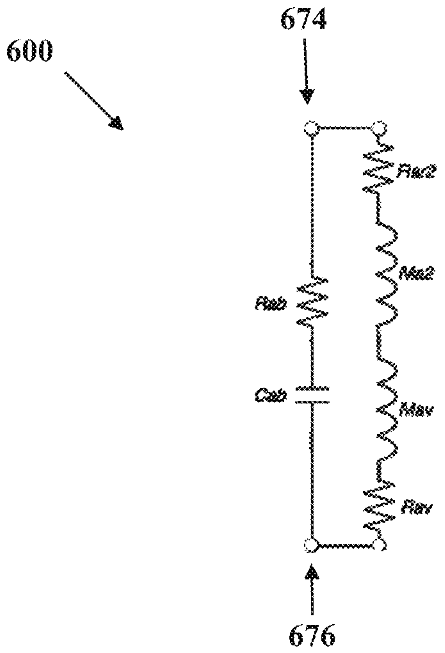
FIG. 6 depicts a representation of a loudspeaker system configuration according to one or more embodiments.
Figure 7:
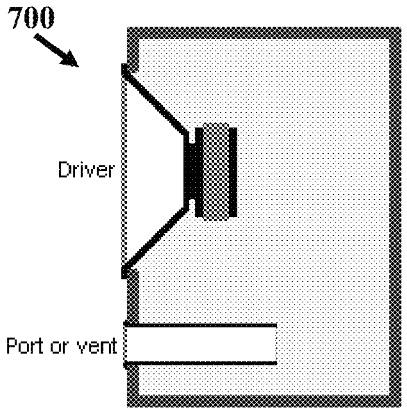
FIG. 7 depicts a typical ported loudspeaker.
Figure 8:
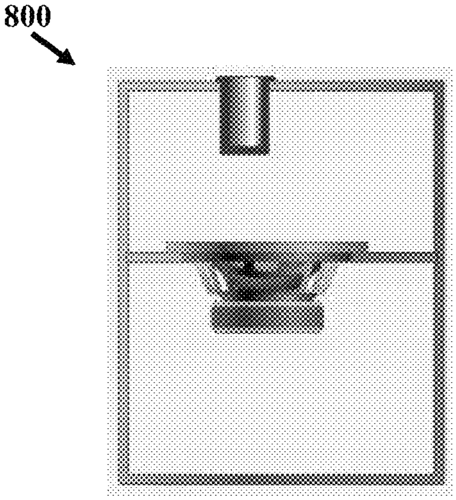
FIG. 8 depicts a typical bandpass loudspeaker.

FIGS. 5 and 6 depict representations of loudspeaker system configurations according to one or more embodiments. Loudspeaker system configuration 500 represents a configuration that can be employed by a ported common chamber of embodiments of the loudspeaker system described herein, such as ported common chamber 100 of loudspeaker system 100 in FIG. 1. Loudspeaker system configuration 600 represents a configuration that can be employed by a ported side chamber of embodiments of the loudspeaker system described herein, such as ported side chamber 130 of loudspeaker system 100 in FIG. 1. FIGS. 5 and 6 employ the following component abbreviations: $M_{ad}$—acoustic mass of the diaphragm/voice coil; $M_{md}$— mechanical mass as measured; $M_{a1}$—acoustic radiation mass (air load) for the front side of the diaphragm; $M_{a2}$—acoustic radiation mass (air load) of the vent/port; $M_{ab}$—acoustic mass of the air load on the rear side of the diaphragm; $M_{av}$—acoustic mass of air in the vent/port; $C_{as}$—suspension acoustic compliance; $C_{ab}$—acoustic compliance of the chamber; $E_g$—open circuit voltage of an audio amplifier; $R_E$—internal resistance of the audio amplifier; $R_{as}$—acoustic resistance of suspension; $R_{ar1}$—acoustic radiation resistance for the front side of the diaphragm; $R_{ar2}$—acoustic radiation resistance of the vent/port; $R_{ab}$—acoustic resistance of the chamber; $R_{av}$—acoustic resistance of air in the vent/port; $U_d$—volume velocity of the diaphragm; $U_s$—volume velocity of the chamber; $U_v$—volume velocity of the vent/port. In particular, FIG. 5 includes elements 570 and 572, which may represent terminals of an amplifier and/or signal processing unit coupled to a loudspeaker system, and elements 574, 576, 578, and 580, which may represent other points within a loudspeaker system to which additional representational circuitry can be attached. Similarly, FIG. 6 includes elements 674 and 676, which may also represent other points within a loudspeaker system to which additional representational circuitry can be attached.

FIG. 5 shows the acoustical equivalent circuit for a conventional ported loudspeaker that may be adjusted to represent an embodiment of a hybrid loudspeaker system. For example, it is customary to simplify the circuit by combining the elements $M_{ad}$, $M_{ab}$ $M_{a1}$, however this practice prevents isolating $M_{ab}$ (the acoustic mass of the air load on the rear of the diaphragm). These elements remain independent to aid in describing the embodiments herein. Furthermore, a second speaker in the same ported chamber (e.g., ported common chamber 120 in FIG. 1) changes the values of some equivalent circuit components but the overall circuit topology remains the same. For example, introducing a second speaker with substantially identical parameters into the first chamber will double the air (mass) load and halve the radiation resistance on the diaphragms since there are now two. The resistance and compliance of the ported common chamber volume remains unchanged as does the vent/port air (mass) load, its acoustic mass and acoustic resistance. Changes to the speaker parameters due to the proximate mountings are relatively minor and can be ignored.

Operating a second speaker from an independent amplifier doubles the available power and opens the possibility for independent signal processing. Separate signal processing can encompass a myriad of changes that will affect the interaction between the two speakers, notwithstanding that which is imposed by pressure. Assuming that the only difference is a modicum of delay to the direct radiating speaker, then increased output may result from normalizing the group delay of the two speakers, due to, for example, group delay changes imposed by the vented/ported side chamber.

A ported side chamber in front of the second speaker introduces a parallel set of chamber and vent/port elements with respect to the front radiation of that device, as shown in FIG. 6. This however, does not negate the influence of the two speakers on one another by way of the acoustic resistance and acoustic compliance of the ported common chamber which they share, shown in FIG. 5. For example, to represent a full embodiment of a loudspeaker system similar to that shown in FIG. 1, the circuit shown in FIG. 6 may be attached to the circuit shown in FIG. 5 by coupling elements 574 and 674 together and by coupling elements 576 and 676 together. Therefore, combining the representations shown in FIGS. 5 and 6 may produce a combined circuit diagram representing a hybrid loudspeaker such as those embodiments described herein.

Thus, the hybrid design of the loudspeaker system combines attributes of direct radiating and bandpass configurations to reduce distortion and optimize amplitude and phase responses while providing increased output levels relative to similarly sized, conventional loudspeakers.

While this disclosure has been particularly shown and described with references to exemplary embodiments thereof, it will be understood by those skilled in the art that various changes in form and details may be made therein without departing from the scope of the embodiments encompassed by the appended claims.

What is claimed is:

1. A loudspeaker system comprising:

a first speaker to provide a direct radiating output from a front of the loudspeaker system; and a second speaker to drive a ported side chamber of the loudspeaker system, wherein the first and second speakers are substantially identical, wherein the first and second speakers share a ported common chamber, and wherein at least one port of the ported common chamber exits the front of the loudspeaker system;

wherein each speaker is coupled to a separate amplifier and signal processing unit, and wherein each separate amplifier and signal processing unit comprises one or more circuit elements disposed within the ported common chamber, coupled to the first and/or second speakers, and configured to provide a program delay to synchronize an acoustic output of at least one of the first and second speakers with an acoustic output of the at least one port exiting the front of the loudspeaker system.

2. The loudspeaker system of claim 1, wherein the first and second speakers exhibit two distinct impedance curve tunings while sharing the at least one port of the ported common chamber.

3. The loudspeaker system of claim 1, wherein the first and second speakers operate most efficiently at frequencies below 500 Hz.

4. The loudspeaker system of claim 1, wherein the at least one port of the ported common chamber is substantially aligned with the front of the loudspeaker system.

5. The loudspeaker system of claim 1, wherein the program delay increases the effective volume of the ported common chamber with respect to each one of the first and second speakers, and wherein the effective volume of the ported common chamber with respect to each one of the first and second speakers is related to an acoustic mass of an air load on the first and second speakers provided by the ported common chamber.

6. The loudspeaker system of claim 1, further comprising the separate amplifier and signal processing unit for each of the first and second speakers.

7. The loudspeaker system of claim 1, the one or more circuit elements are configured to synchronize the combined output of the first and second speakers.

8. The loudspeaker system of claim 1, wherein port tunings of the ported chambers combine to minimize transducer excursion of the speakers within an operating passband of the loudspeaker system.

9. The loudspeaker system of claim 1, wherein the one or more circuit elements are configured to generate a summed acoustic output of the loudspeaker system that is substantially uniform in magnitude and phase and characterized by low distortion and high output capability relative to a similarly sized alternative loudspeaker system comprising only the first speaker or the second speaker.

10. The loudspeaker system of claim 1, wherein the one or more circuit elements are configured to synchronize the outputs of the first and second speakers.

11. The loudspeaker system of claim 1, wherein the ported side chamber is configured to have substantially fourth-order response characteristics.

12. The loudspeaker system of claim 1, wherein the loudspeaker system provides an output passband with substantially sixth-order high-pass response characteristics and substantially first-order low-pass response characteristics.

13. A loudspeaker system comprising:

an enclosure having a ported common chamber and a ported side chamber;

a first speaker providing a direct radiating output; and a second speaker driving the ported side chamber of the enclosure, wherein the first and second speakers are substantially identical, wherein the first and second speakers share the ported common chamber of the enclosure, and wherein at least one port of the ported common chamber exits the front of the loudspeaker system and/or is substantially aligned with the front of the loudspeaker system and/or the first speaker;

wherein the first and second speakers are coupled to an amplifier in one of a series and a parallel configuration, wherein one of the first or second speakers is coupled to the amplifier with inverted polarity, and wherein each speaker is coupled to one or more circuit elements disposed within the ported common chamber, coupled to the first and/or second speakers, and configured to provide a program delay to synchronize an acoustic output of at least one of the first and second speakers with an acoustic output of the at least one port exiting the front of the loudspeaker system.

14. The loudspeaker system of claim 13, further comprising the one or more circuit elements disposed within the ported common chamber, wherein the program delay increases the effective volume of the ported common chamber with respect to each one of the first and second speakers, and wherein the effective volume of the ported common chamber with respect to each one of the first and second speakers is related to an acoustic mass of an air load on the first and second speakers provided by the ported common chamber.

15. The loudspeaker system of claim 13, wherein the amplifier comprises an amplifier circuit, the loudspeaker system further comprising a digital signal processing circuit and the amplifier circuit for driving the first and second speakers.

16. The loudspeaker system of claim 13, wherein the first and second speakers are coupled to the amplifier in the parallel configuration with respect to output terminals of the amplifier.

17. The loudspeaker system of claim 13, wherein the one or more circuit elements are configured to generate a summed acoustic output of the the loudspeaker system that is substantially uniform in magnitude and phase and characterized by low distortion and high output capability relative to a similarly sized alternative loudspeaker system comprising only the first speaker or the second speaker.

18. The loudspeaker system of claim 13, wherein the one or more circuit elements configured to synchronize the combined output of the first and second speakers.

19. The loudspeaker system of claim 13, wherein the ported side chamber is configured to have substantially fourth-order response characteristics.

20. The loudspeaker system of claim 13, wherein the loudspeaker system provides an output passband with substantially sixth-order high-pass response characteristics and substantially first-order low-pass response characteristics.

* * * * *